(12) United States Patent
Villanueva et al.

(10) Patent No.: US 6,757,181 B1
(45) Date of Patent: Jun. 29, 2004

(54) MOLDED SHIELD STRUCTURES AND METHOD FOR THEIR FABRICATION

(75) Inventors: Roberto U. Villanueva, Rancho Santa Margarita, CA (US); Hassan S. Hashemi, Laguna Niguel, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 09/644,035

(22) Filed: Aug. 22, 2000

(51) Int. Cl.[7] .............................................. H05K 9/00
(52) U.S. Cl. ...................... 361/816; 361/818; 174/35 R
(58) Field of Search ................................. 361/816, 818, 361/760–764; 174/52.2–52.3, 52.4, 35 R, 35 GC; 257/723–725, 787–790

(56) References Cited

U.S. PATENT DOCUMENTS

| | | | | |
|---|---|---|---|---|
| 5,166,772 A | * | 11/1992 | Soldner et al. | 257/659 |
| 5,309,321 A | * | 5/1994 | Olla et al. | 361/714 |
| 5,355,016 A | * | 10/1994 | Swirbel et al. | 257/359 |
| 5,436,203 A | * | 7/1995 | Lin | 437/209 |
| 5,455,456 A | * | 10/1995 | Newman | 257/704 |
| 5,530,202 A | * | 6/1996 | Dais et al. | 174/35 R |
| 5,763,824 A | * | 6/1998 | King et al. | 174/35 R |
| 5,767,447 A | * | 6/1998 | Dudderar et al. | 174/52.4 |
| 5,905,633 A | * | 5/1999 | Shim et al. | 361/704 |
| 6,191,360 B1 | * | 2/2001 | Tal et al. | 174/52.4 |

\* cited by examiner

*Primary Examiner*—David A. Zarneke
*Assistant Examiner*—Tuan Dinh
(74) *Attorney, Agent, or Firm*—Farjami & Farjami LLP

(57) ABSTRACT

Molded shield structures and method for their fabrication are disclosed. According to one embodiment, a die is attached to a printed circuit board, for example, by using a die attach epoxy. Thereafter, at least one post is attached to the printed circuit board adjacent to the die. The at least one post can be, for example, made of copper or solder-coated ceramic. A shield is then mounted on the at least one post. The shield encloses an area on the printed circuit board which includes the die and may include additional elements, such as passive devices. The shield can be, for example, made of stainless steel, copper, or a copper alloy. In one embodiment, the shield is a wire mesh which can be made of copper or aluminum. After mounting the shield, a molding compound is used to encapsulate the shield, the at least one post, the die, and any additional elements, such as passive devices, that are enclosed by the shield.

24 Claims, 2 Drawing Sheets

MOLDED SHIELD STRUCTURES AND METHOD FOR THEIR FABRICATION

FIELD OF THE INVENTION

The present invention is generally in the field of printed circuit board packaging. More specifically, the invention is in the field of over-molded integrated circuit "IC") packages on printed circuit boards.

BACKGROUND ART

Metal shields are used on a printed circuit board to protect sensitive devices on the printed circuit board from electric fields emanating from other devices present on the printed circuit board or from the surrounding environment. The metal shield is generally connected to ground on the printed circuit board. Thus, the metal shield blocks electric fields by grounding any electric fields that contact the metal shield, thus preventing them from entering the area on the printed circuit board enclosed by the metal shield, also referred to as the "enclosed area". These metal shields are fabricated from metals such as stainless steel, copper, or copper alloys.

In a known surface mount over-molded printed circuit board package manufacturing process, passive devices such as capacitors are attached to the printed circuit board first. After the passive devices have been attached, a semiconductor die may be attached within the same area on the printed circuit board where the passive devices are located. Wire bonding is then performed between die bonding pads on the semiconductor die and printed circuit board bonding pads.

Generally, after wire bonding and prior to mounting of the metal shield over the semiconductor die and passive devices, a glob of epoxy coating is used to cover the semiconductor die and the bond wires to protect the die from moisture and other contamination. The metal shield is then mounted on the printed circuit board and encloses the "glob topped" semiconductor die and the passive devices. The metal shield is typically attached to the printed circuit board by soldering it (i.e. the metal shield) to an exposed ground interconnect on the board. The introduction of the "glob top" epoxy involves dispensing precision thin epoxy over the die and bond wires and as such is a slow and expensive process.

There are other problems besides the long time and expense associated with the known method described above for shielding the semiconductor die and discrete passive components on the printed circuit board. One problem is that the metal shield may not be securely attached to the board or may loosen over time due to breakage or abuse. Also, if pressure is applied to the metal shield it may be deformed and it may contact the passive devices that it is shielding, resulting in electrical shorts or opens.

Another problem with the known method described above is that generally only the semiconductor die is encapsulated in the epoxy compound. The other devices under the metal shield are still subject to moisture and contamination that may enter the enclosed area through openings in the metal shield. In addition, it is sometimes difficult to control the application of the epoxy compound to the semiconductor die. As a result, there may be bond wires that are not encapsulated and therefore remain exposed, resulting in a higher likelihood of damage to the bond wires.

Thus, it is seen that there is a need in the art for a method and structure to overcome the problems associated with the presently known methods for shielding a semiconductor die and neighboring discret passive components used in a printed circuit board.

SUMMARY OF THE INVENTION

The present invention is directed to molded shield structures and method for their fabrication. The invention's method and structure overcomes the problems associated with the presently known methods for shielding an enclosed area on a printed circuit board.

According to one embodiment of the invention, a die is attached to a printed circuit board, for example, by using a die attach epoxy. Thereafter, at least one post is attached to the printed circuit board adjacent to the die. The at least one post can be, for example, made of copper or solder-coated ceramic.

A shield is then mounted on the at least one post. The shield encloses the area on the printed circuit board which includes the die and may include additional elements, such as passive devices. The shield can be, for example, made of stainless steel, copper, or a copper alloy. In one embodiment, the shield is a wire mesh which can be made of copper or aluminum. After mounting the shield, a molding compound is used to encapsulate the shield, the at least one post, the die, and any additional elements, such as passive devices, that are enclosed by the shield.

DETAILED DESCRIPTION OF THE INVENTION

The present invention is directed to molded shield structures and method for their fabrication. The following description contains specific information pertaining to different types of materials, layouts, dimensions, and implementations of the invention. One skilled in the art will recognize that the present invention may be practiced with material, layouts, dimensions, and implementations different from those specifically discussed in the present application. Moreover, some of the specific details of the invention are not discussed in order to not obscure the invention. The specific details not discussed in the present application are within the knowledge of a person of ordinary skills in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

Figure 1:
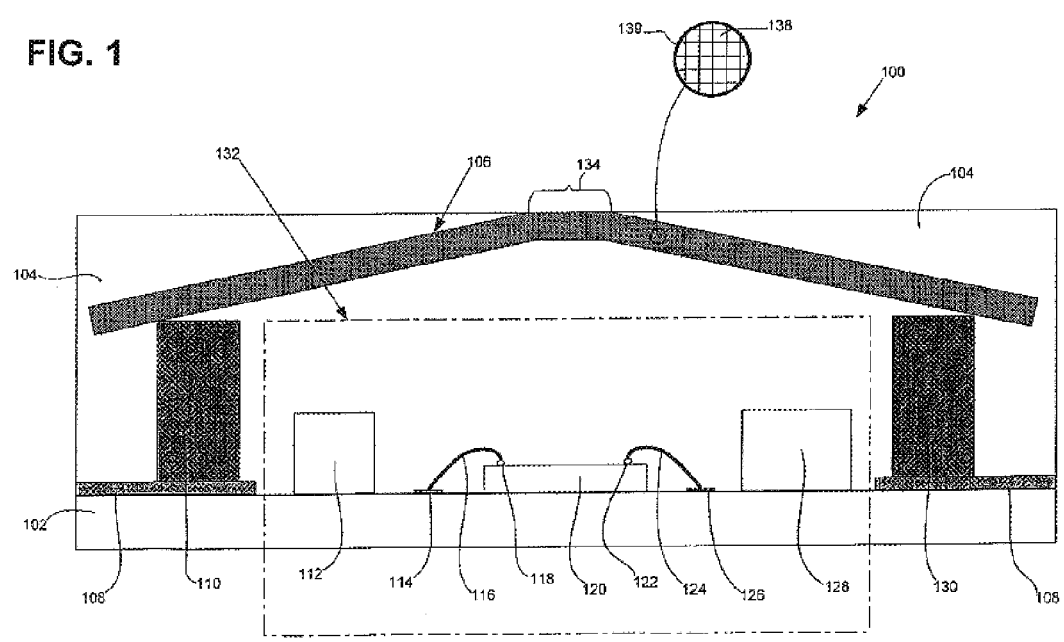
FIG. 1 illustrates a wire mesh shield and posts structure enclosing an area where passive devices and a semiconductor die are situated on a plastic laminate-based over-molded printed circuit board package.

FIG. 1 shows a cross section of one embodiment of the invention. Plastic laminate-based over-molded printed circuit board package 100, also referred to as over-molded package 100, comprises a layer of resin, referred to by numeral 102. Situated on top of resin 102, but not covering all of resin 102, is a layer of metal interconnect, referred to by numeral 108. Metal interconnect layer 108 is part of a top interconnect layer in the printed circuit board and is typically made of copper. The top (or bottom) copper interconnect layers in the printed circuit board can be plated with nickel or gold to provide protection and also for ease of soldering and bonding. Passive devices 112 and 128 are surface mounted on the printed circuit board. Semiconductor die 120 is attached to the printed circuit board between passive devices 112 and 128 by applying a die attach epoxy (not shown in any of the Figures) to the die attach area on the printed circuit board. Passive devices 112 and 128 and semiconductor die 120 are situated in the enclosed area on the printed circuit board, referred to by numeral 132.

Die bonding pads 118 and 122 are situated on top of semiconductor die 120. A first end of bond wire 116 is bonded to die bonding pad 118. A second end of bond wire 116 is bonded to printed circuit board bonding pad 114, which is situated on the printed circuit board. A first end of bond wire 124 is bonded to die bonding pad 122. A second end of bond wire 124 is bonded to printed circuit board bonding pad 126, which is situated on the printed circuit board.

Interconnect 108 is connected to ground. Post 110 is situated on top of and is in contact with interconnect 108. Thus, post 110 is connected to ground through interconnect 108. Post 130 is also situated on top of and is in contact with interconnect 108. Thus, post 130 is connected to ground through interconnect 108. Post 110 and post 130 can be solid copper, aluminum, or solder-coated ceramic. As seen in FIG. 1, posts 110 and 130 are situated adjacent to die 120 and passive devices 112 and 128. Although only two posts are shown in FIG. 1, the actual number of posts in the present embodiment is four but could be any number.

Metal shield 106 is situated on top of and is in contact with posts 110 and 130 and completely encloses the enclosed area of the printed circuit board where passive devices 112 and 128 and semiconductor die 120 are located. Metal shield 106 is a wire mesh structure which can be fabricated from copper or aluminum. The mesh opening, shown in expanded view 139 and referred to by numeral 138, is of a size chosen based on the frequency and amplitude of the emanating high frequency fields present on the printed circuit board. The size of mesh opening 138 will always be chosen to be less than one tenth the wavelength of the highest signal frequency present in over-molded package 100. As an example, if the highest signal frequency in over-molded package 100 is 1.8 giga Hertz, the mesh opening needs to be smaller than 9 millimeters.

Generally, as discussed above in relation to a known process in surface mount printed circuit board package manufacturing process, after the passive devices and semiconductor die have been attached to the printed circuit board and after the wire bonding process is completed, an epoxy glob is used to cover the semiconductor die to provide protection against moisture and other contamination. A metal shield enclosing the semiconductor die and the passive devices is then soldered or attached to a printed is circuit board ground interconnect via a conductive epoxy.

As discussed above, there are problems with using this known process. One problem is that the introduction of the "glob top" epoxy involves dispensing precision thin epoxy over the die and bond wires and as such is a slow and expensive process. Examples of other problems are that the metal shield may not be securely attached to the board or may loosen over time due to breakage or abuse. Also, if pressure is applied to the metal shield it may be deformed and it may contact the passive devices that it is shielding, resulting in electrical shorts or opens. Another problem with the known method described above is that generally only the semiconductor die is encapsulated in the epoxy compound. The other devices under the metal shield are still subject to moisture and contamination that may enter the enclosed area through openings in the metal shield. In addition, it is sometimes difficult to control the application of the epoxy compound to the semiconductor die. As a result, there may be bond wires that are not encapsulated and therefore remain exposed, resulting in a higher likelihood of damage to the bond wires.

The invention overcomes these problems by using the over-molded printed circuit board package manufacturing method discussed below. After the attachment of passive devices 112 and 128, semiconductor die 120 and posts 110 and 130, metal shield 106 is attached to the posts before any molding is applied to the enclosed area. It is noted that posts 110 and 130 can be attached either before or after semiconductor die 120 is attached. Metal shield 106 is pre-cut from wire mesh to the size of the mold cavity in the molding machine. The center area of metal shield 106, which is shown by the bracket referred to in FIG. 1 by numeral 134, is a flat piece that is parallel to resin 102 instead of being at an angle to resin 102 as is the remainder of metal shield 106. Metal shield 106 is inserted into the molding machine first. Then the printed circuit board with the mounted devices and posts is placed in the mold cavity of the molding machine. The molding machine closes and clamps to shut off the mold cavity. This clamping process brings metal shield 106 in contact with posts 110 and 130. The top of the mold cavity surface will continue to apply pressure to center area 134 of metal shield 106 until metal shield 106 is secured to posts 110 and 130 by the spring contact effect created by the dished shape of metal shield 106.

Because the invention attaches metal shield 106 prior to filling the mold cavity with mold compound 104, the metal shield 106 and the areas under metal shield 106 are inside the vacuum created by the mold cavity. The vacuum created under metal shield 106 ensures that mold compound 104 will flow into and completely fill the enclosed area under metal shield 106 as well as encapsulating the entire metal shield and post structure. By using this method, the invention provides greater protection to semiconductor die 120 as well as protecting the passive devices in the enclosed area.

After the vacuum is created within the mold cavity, the mold cavity is transfer filled with a semiconductor grade molding epoxy 104, which can generally comprise compounds such as multifunctional epoxy, novolac, and biphenyl resin, and which can specifically be selected from commercially available compounds such as Sumitomo® 7720, Sumitomo® 7730 or Plaskon® SMT-B-1. Mold compound 104 penetrates under metal shield 106 and through openings 138 in metal shield 106 to completely encapsulate all the devices in the enclosed area as well as the entire metal shield and post structure. Mold compound 104 hardens during a curing cycle. The mold clamp opens after the curing cycle and ejects over-molded package 100.

Metal shield 106 can be copper or aluminum wire mesh and tends to be soft. As a result of this softness, the spring contact effect created by the dished shape of metal shield 106 is not strong enough to securely hold metal shield 106 in place over posts 110 and 130. However, as a result of the invention, metal shield 106 is now encapsulated in mold compound 104 and is more securely fastened to posts 110 and 130. It is noted that mesh openings 138 allow for greater encapsulation of the enclosed area by mold compound 104 by allowing mold compound 104 to enter through mesh openings 138 of metal shield 106 as well as from underneath metal shield 106. Thus, the reliability of the metal shield and post structure has been significantly improved.

In addition, because mold compound 104 now completely fills the enclosed area under metal shield 106 and therefore provides structural support to metal shield 106, metal shield 106 is less likely to be deformed and contact the semiconductor die, the bond wires and passive devices in the enclosed area. Thus, the invention provides greater protection against electrical shorts and opens that could result from a deformed metal shield.

The invention provides good adhesion of mold compound 104 to metal shield 106, thus preventing the separation of mold compound 104 from the surface of metal shield 106. This separation is generally referred to as "delamination". One of the main reasons for delamination is the presence of moisture within mold compound 104 and resin 102 on over-molded package 100. Such moisture may result from over-molded package 100 being subjected to a humid environment. The moisture turns to vapor when heated and tries to escape into the environment, thus applying an upward pressure to mold compound 104 which may result in separation of mold compound 104 from the surface of metal shield 106. Physical abuse and normal wear and tear are other additional causes of delamination.

The invention provides protection against delamination in the following manner. When mold compound 104 enters the mold cavity, it covers the surface of metal shield 106 as well as filling the enclosed area under metal shield 106. Mold compound 104 is forced through mesh openings 138 of metal shield 106. After mold compound 104 hardens, the portions of mold compound 104 within mesh openings 138 act as plugs that essentially "stake down" mold compound 104 to metal shield 106. Thus, the invention provides adhesion of mold compound 104 to metal shield 106.

Figure 2:
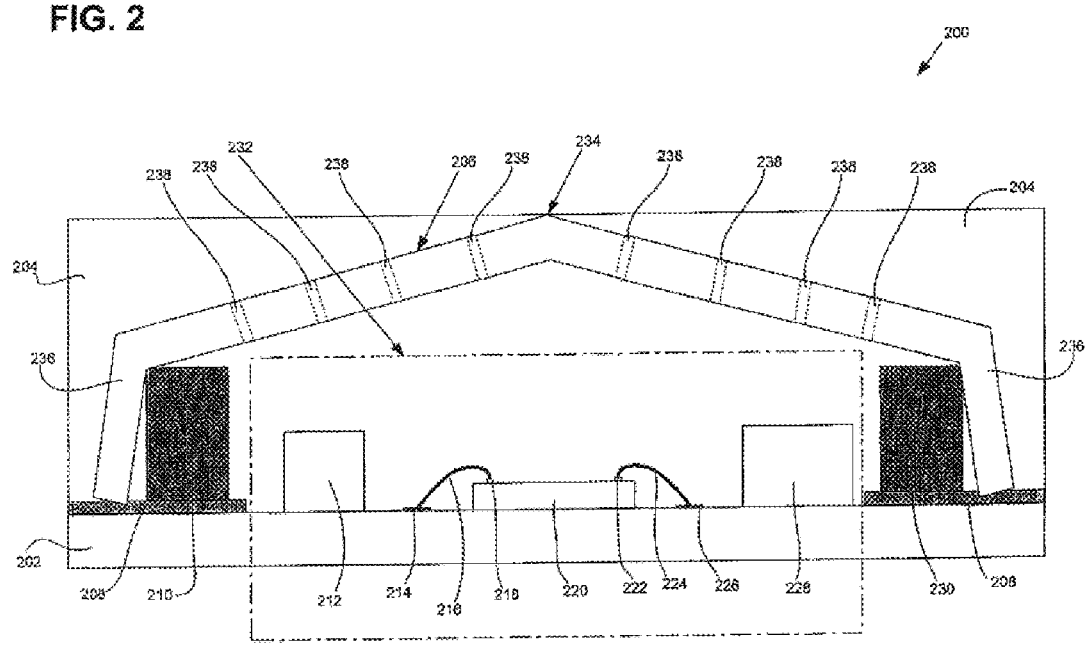
FIG. 2 illustrates a stamped metal shield and posts structure enclosing an area where passive devices and a semiconductor die are situated on a plastic laminate-based over-molded printed circuit board package.

FIG. 2 shows a cross section of another embodiment of the invention. Laminate over-molded printed circuit board package 200, also referred to as over-molded package 200, comprises a layer of resin, referred to by numeral 202. Situated on top of resin 202 is a layer of metal interconnect, referred to by numeral 208. This interconnect layer can be copper. Passive devices 212 and 228 are surface mounted to the printed circuit board. Semiconductor die 220 is attached to the printed circuit board between passive devices 212 and 228 in a manner known in the art. Passive devices 212 and 228 and semiconductor die 220 are situated in the enclosed area on the printed circuit board, referred to by numeral 232.

Die bonding pads 218 and 222 are situated on top of semiconductor die 220. A first end of bond wire 216 is bonded to die bonding pad 218. A second end of bond wire 216 is bonded to printed circuit board bonding pad 214, which is situated on the printed circuit board. A first end of bond wire 224 is bonded to die bonding pad 222. A second end of bond wire 224 is bonded to printed circuit board bonding pad 226, which is situated on the printed circuit board.

Interconnect 208 is connected to ground. Post 210 is situated on top of and is in contact with interconnect 208. Thus, post 210 is connected to ground through interconnect 208. Post 230 is also situated on top of and is in contact with interconnect 208. Thus, post 230 is connected to ground through interconnect 208. Post 210 and post 230 can be solid copper or a solder-coated ceramic. As seen in FIG. 2, posts 210 and 230 are situated adjacent to die 220 and passive devices 212 and 228. Although only two posts are shown in FIG. 2, the actual number of posts in the present embodiment is four but could be any number.

Metal shield 206 is situated on top of and is in contact with posts 210 and 230 and completely encloses the enclosed area of the printed circuit board where passive devices 212 and 228 and semiconductor die 220 are located.

As in the first embodiment described above, in the present embodiment passive devices 212 and 228 and semiconductor die 220 are first attached to the printed circuit board. After attaching the die and other devices and completing the wire bonding process, posts 210 and 230 are attached. It is noted, however, that posts 210 and 230 can also be attached to the printed circuit board prior to attaching semiconductor die 220. Metal shield 206 is then attached to the posts before any molding is applied to the enclosed area comprising passive devices 212 and 228, posts 210 and 230, semiconductor die 220, and bond wires 224 and 216.

In the present embodiment, metal shield 206 is a substantially solid stamped metal structure which can be fabricated from stainless steel, copper or copper alloys. In the present embodiment, metal shield 206 has a square shape and the four corners of the stamped metal are notched and folded down to form corners that "snap" onto posts 210 and 230. These corners are referred to by numeral 236. The center area of metal shield 206 has a protruding conical shape, referred to in FIG. 2 by numeral 234.

Holes or slits are punched into metal shield 206 and are located in various places on metal shield 206. These holes are represented in FIG. 2 by dashed lines and are referred to by numeral 238. The size of each hole 238 is chosen based on the frequency and amplitude of the emanating high frequency fields present in over-molded package 200. As was the case with the mesh openings in the first embodiment, the size of the hole will always be chosen to be less than one tenth the wavelength of the highest signal frequency present in over-molded package 200. As an example, if the highest signal frequency in over-molded package 200 is 1.8 giga Hertz, the diameter of each hole 238 should be less than 9 millimeters.

Metal shield 206 is inserted over the posts 210 and 230 and "snaps" in place. Another option is inserting the metal shield 206 into the molding machine first. Then the printed circuit board with the mounted devices and posts is placed in the mold cavity of the molding machine. The molding machine closes and clamps to shut off the mold cavity. This clamping process brings metal shield 206 in contact with posts 210 and 230. Cone 234 at the top of metal shield 206 will be compressed by the top surface of the mold cavity until the corners of metal shield 206 "snap" over posts 210 and 230. Metal shield 206 is thus secured to posts 210 and 230.

For the reasons mentioned in the discussion of the first embodiment (i.e. over-molded package 100 in FIG. 1), prior to filling the mold cavity with mold compound 204, a vacuum is created in the mold cavity and therefore under metal shield 206. After the vacuum is created within the mold cavity, the mold cavity is transfer filled with mold compound 204, which can be Sumitomo® 7720, Sumitomo® 7730 or Plaskon® SMT-B1. Mold compound 204 penetrates under metal shield 206 and through holes 238 to completely encapsulate all the devices in the enclosed area as well as the entire metal shield and post structure. After mold compound 204 hardens, the portions of mold compound 204 within holes 238 act as plugs that "stake down" mold compound 204 to metal shield 206. Mold compound 204 hardens during a curing cycle. The mold clamp opens after the curing cycle and ejects over-molded package 200.

Like over-molded package 100, one of the advantages of over-molded package 200 is the greater strength of the bond between metal shield 206 and posts 210 and 230 which results from the encapsulation of metal shield 206 in mold compound 204. Another advantage is the greater structural support for metal shield 206 provided by mold compound 204. Also, mold compound 204 has a strong adhesion to metal shield 206, thus preventing the separation of mold compound 204 from the surface of metal shield 206.

Thus, it is seen that the invention attaches a metal shield more securely over the enclosed area on the printed circuit board and encapsulates the metal shield and the entire enclosed area underneath the shield in mold compound, resulting in significantly higher reliability of the overmolded package and the prevention of deformation of the metal shield. Further, the invention allows the integration of the metal shield and post structures into the standard overmolding process, which is more cost-effective. In addition, the invention allows for more control of the application of the mold compound to the semiconductor die, resulting in complete coverage of the bond wires and therefore decreasing the likelihood of future damage to the bond wires.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, molded shield structures and method for their fabrication have been described.

What is claimed is:

1. A structure comprising:
   a printed circuit board;
   a die attached to said printed circuit board;
   a post attached on said printed circuit board, said post being adjacent to said die;
   a shield secured to said post by pressing said shield against said post, said shield enclosing said die and said post; and
   a mold compound encapsulating said shield, said post, and said die.

2. The structure of claim 1 further comprising a bond wire having a first end attached to a die bonding pad on said die and a second end attached to a printed circuit board bonding pad on said printed circuit board.

3. The structure of claim 1 wherein said post comprises copper.

4. The structure of claim 1 wherein said post comprises solder-coated ceramic.

5. The structure of claim 1 wherein said shield comprises metal, said metal being selected from the group consisting of stainless steel, copper, and copper alloy.

6. The structure of claim 1 wherein said shield comprises a wire mesh.

7. The structure of claim 1 wherein said molding compound is selected from the group consisting of multifunctional epoxy, novolac, and biphenyl resin.

8. The structure of claim 1 wherein said die is attached to said printed circuit board by a die attach epoxy.

9. The structure of claim 1 wherein said shield is mounted on said post by press fitting said shield onto said post.

10. The structure of claim 1 wherein said printed circuit board comprises a first layer of metal interconnect in contact with said post, said first layer of metal interconnect being connected to a ground.

11. The structure of claim 10 wherein said first layer of metal interconnect is selected from the group consisting of copper, aluminum, or an aluminum-copper alloy.

12. The structure of claim 6 wherein said wire mesh comprises metal, said metal being selected from the group consisting of copper and aluminum.

13. A structure comprising:
    a printed circuit board;
    a die attached to said printed circuit board;
    a post attached on said printed circuit board, said post being adjacent to said die;
    a shield mounted on said post by snapping said shield onto said post, said shield enclosing said die and said post;
    a mold compound encapsulating said shield, said post, and said die.

14. The structure of claim 13 wherein said post comprises copper.

15. The structure of claim 13 wherein said post comprises solder-coated ceramic.

16. The structure of claim 13 wherein said shield comprises metal, said metal being selected from the group consisting of stainless steel, copper, and copper alloy.

17. The structure of claim 13 further comprising a bond wire having a first end attached to a die bonding pad on said die and a second end attached to a printed circuit board bonding pad on said printed circuit board.

18. The structure of claim 13 wherein said printed circuit board comprises a first layer of metal interconnect in contact with said post, said first layer of metal interconnect being connected to a ground.

19. A structure comprising:
    a printed circuit board;
    a die attached to said printed circuit board;
    a post attached on said printed circuit board, said post being adjacent to said die;
    a shield mounted on said post by press fitting said shield onto said post, said shield enclosing said die and said post;
    a mold compound encapsulating said shield, said post, and said die.

20. The structure of claim 19 wherein said post comprises copper.

21. The structure of claim 19 wherein said post comprises solder-coated ceramic.

22. The structure of claim 19 wherein said shield comprises metal, said metal being selected from the group consisting of stainless steel, copper, and copper alloy.

23. The structure of claim 19 further comprising a bond wire having a first end attached to a die bonding pad on said die and a second end attached to a printed circuit board bonding pad on said printed circuit board.

24. The structure of claim 19 wherein said printed circuit board comprises a first layer of metal interconnect in contact with said post, said first layer of metal interconnect being connected to a ground.

* * * * *